(12) United States Patent
Miller et al.

(10) Patent No.: US 7,623,358 B2
(45) Date of Patent: Nov. 24, 2009

(54) I/O CARDS AND CARD ARRANGEMENTS FOR I/O DEVICE

(75) Inventors: Steven Edwin Miller, Nevada City, CA (US); Scott Raitt, Grass Valley, CA (US)

(73) Assignee: Thomson Licensing, Boulogne Billancourt (FR)

( * ) Notice: Subject to any disclaimer, the term of this patent is extended or adjusted under 35 U.S.C. 154(b) by 43 days.

(21) Appl. No.: 11/578,398

(22) PCT Filed: Apr. 15, 2005

(86) PCT No.: PCT/US2005/012976

§ 371 (c)(1),
(2), (4) Date: Oct. 12, 2006

(87) PCT Pub. No.: WO2005/103916

PCT Pub. Date: Nov. 3, 2005

(65) Prior Publication Data

US 2007/0276963 A1   Nov. 29, 2007

Related U.S. Application Data

(60) Provisional application No. 60/562,858, filed on Apr. 15, 2004.

(51) Int. Cl.
*H05K 1/11* (2006.01)
(52) U.S. Cl. ......................................... 361/803; 439/61
(58) Field of Classification Search ................. 361/400, 361/778, 779, 803; 439/668, 61
See application file for complete search history.

(56) References Cited

U.S. PATENT DOCUMENTS

| | | | | |
|---|---|---|---|---|
| 4,573,753 A | * | 3/1986 | Vogl | ............................ 439/65 |
| 5,519,573 A | * | 5/1996 | Cobb et al. | ................. 361/686 |
| 5,788,509 A | | 8/1998 | Byers et al. | |
| 5,838,550 A | * | 11/1998 | Morris et al. | ............... 361/818 |
| 5,982,627 A | * | 11/1999 | Haughton et al. | ........... 361/759 |
| 5,990,981 A | | 11/1999 | Thompson et al. | |
| 6,040,981 A | * | 3/2000 | Schmitt et al. | .............. 361/695 |
| 6,144,561 A | | 11/2000 | Cannella, Jr. et al. | |
| 6,752,665 B2 | * | 6/2004 | Kha et al. | .................... 439/668 |
| 6,822,874 B1 | | 11/2004 | Marler | |
| 2002/0190613 A1 | | 12/2002 | Liu | |

OTHER PUBLICATIONS

International Search Report dated Oct. 20, 2005.

\* cited by examiner

*Primary Examiner*—Dean A. Reichard
*Assistant Examiner*—Abiy Getachew
(74) *Attorney, Agent, or Firm*—Robert D. Shedd; Robert B. Levy; Jorge Tony Villabon

(57) ABSTRACT

An improved I/O device, such as an audio/video router, includes at least a motherboard, such as a matrix board, including a plurality of locating slots and a plurality of connectors located on the motherboard such that when the motherboard is mounted in the I/O device, the plurality of connectors are positioned horizontally across the I/O device. The I/O device further includes a plurality of input/output (I/O) cards, such as audio/video cards, each of the I/O cards including a locating slot and two I/O connectors. In an I/O device of the present invention, the locating slot of each of the I/O cards mates with a respective locating slot of the motherboard such that the two I/O connectors of each of the I/O cards vertically straddle a respective connector of the motherboard thus maximizing a number of inputs and outputs able to be provided in the rear of the I/O device.

12 Claims, 4 Drawing Sheets

I/O CARDS AND CARD ARRANGEMENTS FOR I/O DEVICE

CROSS-REFERENCE TO RELATED APPLICATIONS

This application claims the benefit, under 35 U.S.C. §365 of International Application PCT/US05/012976, filed Apr. 15, 2005, which was published in accordance with PCT Article 21(2) on Nov. 3, 2005 in English and which claims the benefit of U.S. provisional patent application No. 60/562,858 filed Apr. 15, 2004.

TECHNICAL FIELD

This invention relates to input/output (I/O devices), and more particularly, to improved I/O cards and I/O card arrangements for facilitating increased numbers of I/O connections in I/O devices.

BACKGROUND ART

As the demand for the intercommunication of greater amounts of information and data increases, so does the need to maximize the efficient utilization of available space in available input/output (I/O) devices. Recently, the number of inputs and outputs able to be facilitated by an I/O device is limited by the space available for providing corresponding I/O connectors and not by information and data processing capacity. That is, typically the number of I/O connectors that are able to be provided by an I/O device is limited by the space available for such I/O connectors on a rear panel of an I/O device. The space available for such I/O connections is limited by such factors as the arrangement of the I/O connectors, the minimum distances between the I/O connectors that is able to be achieved, and the space consumed by other connections typically made in a rear panel of an I/O device, such as power and communication connections. Such spacing limitations and additional connections (e.g., power and communication), however, reduce the number of input and output connections that are able to be provided by an I/O device because the spacing limitations between the I/O connectors are today typically quite large and the additional connections consume valuable space in the rear panel that could be more efficiently and effectively utilized for additional connections for the I/O devices. What is needed is an efficient I/O card and arrangement design and as such, an I/O device design to increase capacity and economy of space requirements for I/O devices.

BRIEF SUMMARY OF THE INVENTION

The present invention addresses the deficiencies of the prior art by providing an improved, high density I/O device.

In one embodiment of the present invention, an improved input/output (I/O) device includes at least a motherboard including a plurality of locating slots and a plurality of connectors located on the motherboard such that when the motherboard is mounted in the I/O device, the plurality of connectors are positioned horizontally across the I/O device. The I/O device further includes a plurality of I/O cards, each of the I/O cards including a locating slot and at least two I/O connectors. In an I/O device of the present invention, the locating slot of each of the I/O cards mates with a respective locating slot of the motherboard such that the at least two I/O connectors of each of the I/O cards vertically straddle a respective connector of the motherboard thus maximizing a number of inputs and outputs able to be provided by the I/O device.

In an alternate embodiment of the present invention, an I/O device as described above further includes a connection receptacle and a cover for removable attachment to the I/O device, where the cover includes an opening for permitting a connector on a cord to extend through the cover to releasably engage the receptacle in the I/O device, and a channel originating at the opening for receiving and guiding the cord. The above described, inventive cover of the I/O device may be either a top cover, a bottom cover, or a top and bottom cover of the I/O device.

In yet an alternate embodiment of the present invention, an I/O card of the I/O device as described above includes a printed circuit board (PCB) and a metallic tab formed on the PC board, the metallic tab formed such that when the I/O card is installed into a metallic housing of the I/O device, the metallic tab contacts the metallic housing and bends back until the metallic tab makes contact with the body of at least one I/O connector thus creating a continuous grounding loop from the at least one contacted I/O connector to the metallic housing.

In one embodiment of the invention, the I/O device comprises an audio/video router, the I/O card comprises an audio/video I/O card, the I/O connectors comprise BNCs, and the motherboard comprises a matrix card.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention advantageously facilitates an improved, high density input/output (I/O) device by providing an improved I/O card and I/O card arrangements. Although throughout the teachings herein and in various embodiments of the present invention, the aspects of the present invention are described with respect to an audio/video router rack mount unit including BNC connectors, the specific embodiments of the present invention should not be treated as limiting the scope of the invention. It will be appreciated by those skilled in the art and informed by the teachings of the present invention that the concepts of the present invention can be advantageously applied to substantially any I/O device and not just rack mount unit I/O devices and including substantially any type of connectors for providing input and output connections for the I/O device.

Figure 1A:
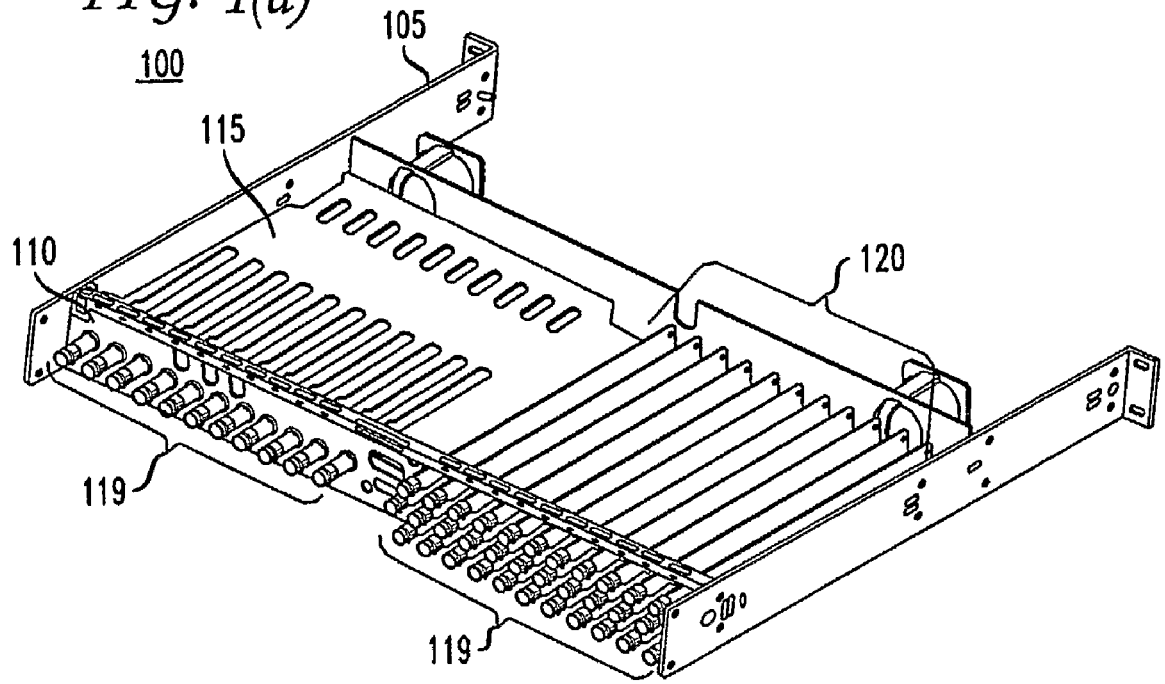
FIG. 1a depicts a high level diagram of a top view of an improved input/output (I/O) device in accordance with an embodiment of the present invention.
Figure 1B:
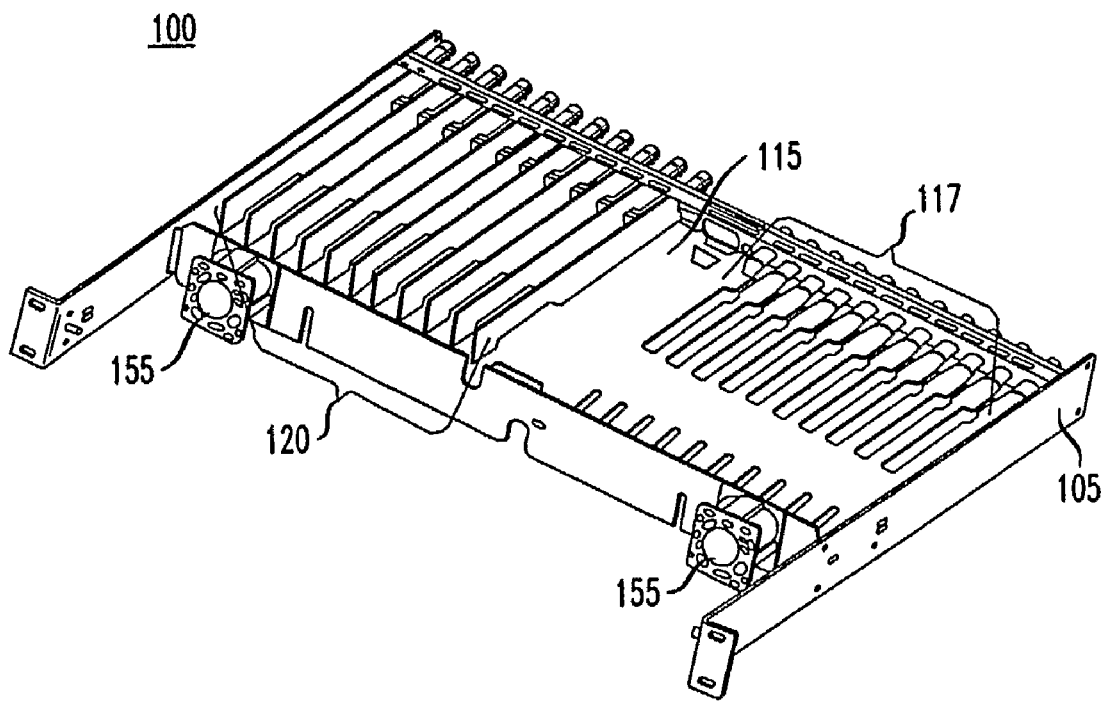
FIG. 1b depicts a high level diagram of a bottom view of an improved I/O device in accordance with an embodiment of the present invention.

FIGS. 1a and 1b depict a high level diagram of a top view and a bottom view, respectively, of an improved I/O device in accordance with an embodiment of the present invention. The I/O device of FIG. 1a and FIG. 1b illustratively comprises an audio/video router for purposes of describing various inventive concepts of the present invention. However, the concepts of the invention are not so limited. That is, the concepts of the present invention may be applied in substantially any I/O device comprising substantially any I/O cards and motherboard.

In FIG. 1a, the top view of the audio/video router 100 is illustratively depicted without a top cover (not shown). The audio/video router 100, as depicted in FIG. 1a, illustratively comprises a rack mount chassis 105, a rear panel 110, a motherboard (illustratively a matrix board) 115, and a plurality of audio/video I/O cards 120. In the audio/video router 100 as depicted in FIG. 1a, the matrix board 115 includes a plurality of I/O card slots 117 for inserting the plurality of audio/video I/O cards 120. In FIG. 1a the matrix board 115 of the audio/video router 100 is illustrated only half populated with audio/video I/O cards 120 to illustrate an embodiment of the slots 117 in the matrix board 115. The matrix board 115 further comprises a plurality of horizontally arranged BNC connectors 119 for facilitating the matrix connections of the audio/video router 100 of the present invention (described in greater detail below with respect to FIG. 2).

In the audio/video router 100 of FIG. 1a, the audio/video I/O cards 120 illustratively each comprise at least two BNC connectors. When an audio/video card 120 is installed in the audio/video router 100, the slot of the audio/video I/O card 120 mates with a respective one of the slots 117 of the matrix board 115 such that the BNC connectors of the installed audio/video card 120 straddle the respective BNC connector 119 of the matrix board 115 (described in greater detail below with respect to FIG. 2). The matrix board 115 and the audio/video I/O cards 120 in an audio/video router in accordance with the present invention, such as the audio video router 100 of FIGS. 1a and 1b, are arranged as described above to most efficiently utilize the space available in the rear of the audio/video router 100 and, as such, in the rear panel 110 of the audio/video router, for maximizing a number of inputs and outputs, and as such, input and output connectors, able to be provided by an I/O device, such as the audio/video router 100 of FIG. 1a, in accordance with the present invention.

For example, the bottom view of the audio/video router 100 in FIG. 1b is depicted without a bottom cover (not shown). FIG. 1b further depicts how the audio/video I/O cards 120 are installed on the matrix board 115. That is and as depicted in FIG. 1b (and described in greater detail below with respect to FIG. 2), a slot in each of the audio/video I/O cards 120 mates with a respective one of the slots 117 in the matrix board 115 when installed in the audio/video router 100, such that that the BNC connectors of an installed audio/video I/O card 120 vertically straddle the respective BNC connector 119 of the matrix board 115. Optionally and as depicted in FIGS. 1a and 1b, the audio/video router 100 of the present invention may further comprises fans 155 for keeping components cool. In addition, although specific number of I/O cards and I/O card slots are depicted in the cards of the audio/video router 100 of FIGS. 1a and 1b, an inventive I/O device of the present invention may comprise substantially any number or combination of I/O cards, motherboards and I/O card slots in accordance with the present invention.

Figure 2:
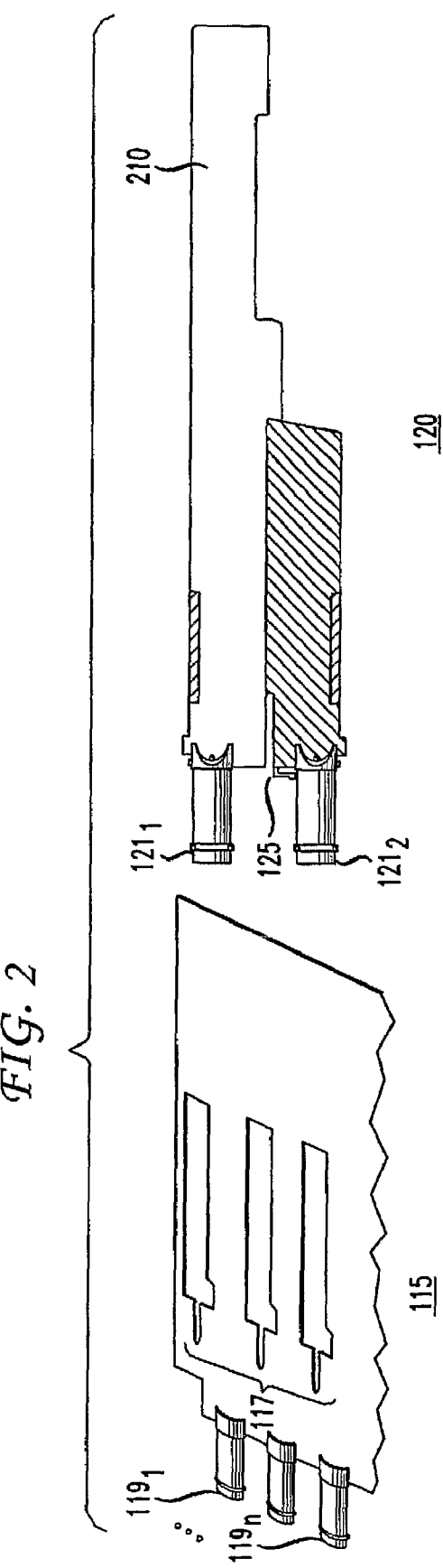
FIG. 2 depicts a high level diagram of an I/O card and an exploded portion of a motherboard in accordance with an embodiment of the present invention.

FIG. 2 depicts a high level diagram of an I/O card and an exploded portion of a motherboard, such as the audio/video I/O card 120 and the matrix board 115, suitable for use in an I/O device, such as the audio/video router 100 of FIGS. 1a and 1b, in accordance with an embodiment of the present invention. The I/O card 120 of FIG. 2 illustratively comprises two BNC connectors $121_1$ and $121_2$, mounted on a printed circuit board (PCB) 123. The PCB 123 of the I/O card 120 further comprises a slot 125 illustratively located between the two BNC connectors $121_1$ and $121_2$. The matrix board 115 of FIG. 2 illustratively comprises a plurality of BNC connectors $119_1$-$119_n$ mounted along a long edge of the matrix board 115. The matrix board 115 further comprises a plurality of slots 117 for mating with the respective slots 125 of the plurality of I/O cards 120.

In accordance with the present invention, when an I/O card, such as the audio/video I/O card 120, is inserted into an I/O device, such as the audio/video router 100, the slot 125 in the I/O card 120 mates with a respective slot 117 of the motherboard 115 such that the BNC connectors $121_1$ and $121_2$ of the I/O card 120 straddle the respective BNC connector 119 of the motherboard 115. In the arrangement of the present invention, the number of I/O connections that are able to be provided by an I/O device is greatly increased. More specifically, with the arrangement of the present invention, an amount of space needed for providing the I/O connectors of an I/O device, such as the BNC connectors $121_1$ and $121_2$ of the I/O card 120 and the BNC connector 119 of the motherboard 115, is greatly reduced. In one experimental embodiment of the present invention, the inventors were able to reduce the center to center spacing between the BNC connectors of an I/O card and respective BNC connectors of a motherboard in an I/O device to 0.64 inches. Therefore, and with such reduced spacing requirements, the numbers of I/O connections and, as such, I/O connectors able to be provided by an I/O device in accordance with the present invention are greatly increased.

Figure 3:
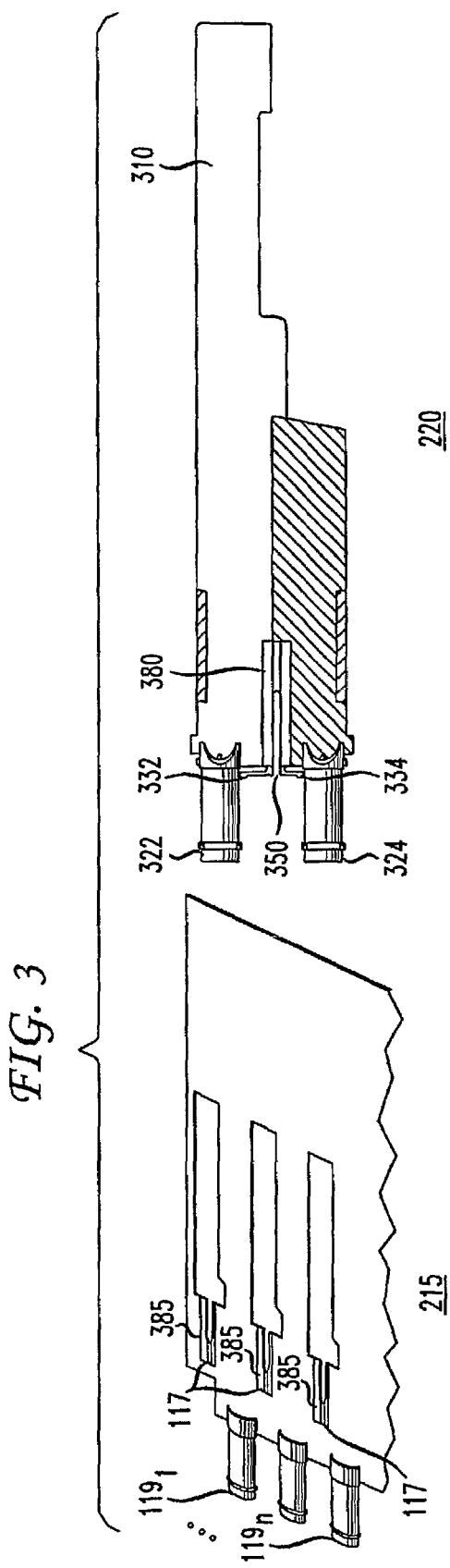
FIG. 3 depicts a high level diagram of an I/O card and a motherboard in accordance with an alternate embodiment of the present invention.

Optionally, an I/O card and a motherboard of the present invention may further comprise a means for providing a continuous grounding loop in an I/O device in accordance with the present invention. For example, FIG. 3 depicts a high level diagram of an audio/video I/O card and a matrix board in accordance with an alternate embodiment of the present invention. The audio/video I/O card 220 and the matrix board 215 of FIG. 3 provide a continuous grounding loop for an I/O device such as the audio/video router 100 of FIGS. 1a and 1b in accordance with the present invention.

More specifically, the I/O card 220 of FIG. 3 comprises a self-grounding I/O card as described in commonly assigned patent application entitled "SELF-GROUNDING I/O CARD", filed simultaneously herewith, the teachings of which are incorporated herein by reference in their entirety. More specifically, the I/O card 220 of FIG. 3 illustratively comprises a printed circuit board (PCB) 310 and metallic PCB edge I/O connectors (illustratively two BNC connectors) 322 and 324, mounted onto the edge of the PCB 310 using any of the methods known in the art for mounting connectors onto PCB's. The self-grounding I/O card 200 of FIG. 3 further comprises a respective tab 332 and 334 formed along the edge of the PCB 310 for each of the metallic I/O connectors 322 and 324. The tabs 332 and 234 formed along the edge of the PCB 310 are metallic. For example, in one embodiment of a self-grounding I/O card in accordance with the present invention, the tabs formed along the edge of the PCB are solder-plated. In alternate embodiments of a self-grounding I/O card in accordance with the present invention, the tabs formed along the edge of the PCB are formed or plated out of other metallic materials such as steel, tin or other conductive metallic composites. Although in FIG. 3, the self-grounding I/O card 200 illustratively comprises two metallic edge I/O connectors 322, 324 and two respective metallic tabs 332, 334, alternate embodiments of a self-grounding I/O card in accordance with the present invention may comprise any number of metallic edge I/O connectors and respective metallic tabs.

When the self-grounding I/O card 200 of FIG. 3, is installed into a metal chassis for housing the I/O card 200, such as the rack mount chassis 105 of FIGS. 1a and 1b, each metallic tab 332, 334 contacts a metal rear panel of the chassis 105 and bends back until the tabs 332, 334 make contact with the body of the respective metallic edge I/O connectors 322, 324, thus creating a continuous grounding loop from the metallic edge I/O connectors 322, 324 to the chassis (not shown). The continuous grounding loop created when the tabs 332, 334 make contact with the body of the metallic edge I/O connectors 322, 224 and with a panel of a metallic chassis that houses the self-grounding I/O card 300, reduces or completely prevents electromagnetic interference (EMI).

As described above, the self-grounding I/O card 200 of FIG. 3 further comprises a slot 350. The slot 350 comprises a cut-out in the PCB 310 completely metallically lined 380 for mating with a motherboard, for example, the matrix board 215. In such an embodiment of the present invention, the motherboard (e.g., matrix board 215) may also have the slot 117 completely metallically lined 385 to create a continuous grounding loop that includes at least the I/O card 200, the matrix board 115, the 110 connectors 322 and 324 of the I/O card 200, the matrix board 115 and the I/O connectors 119 of the matrix board 215.

Figure 4:
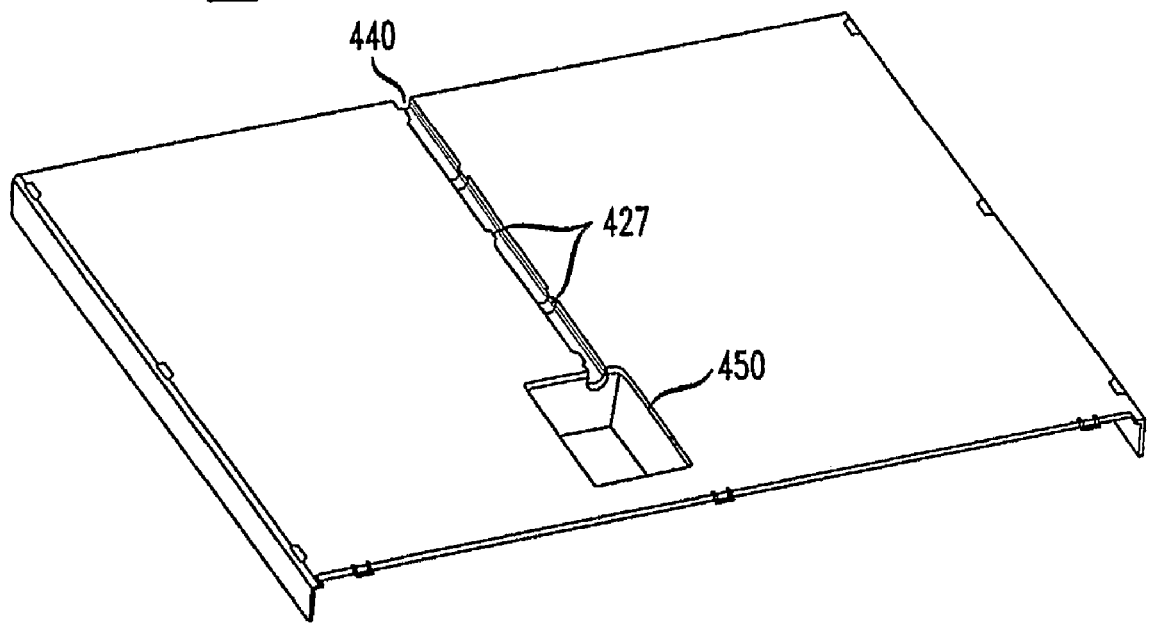
FIG. 4 depicts a high level diagram of a cover including a cord guide and an access opening suitable for use as a top cover or a bottom cover for an I/O device in accordance with an embodiment of the present invention, such as the audio/video router of FIGS. 1a and 1b.

In alternate embodiments of the present invention, an I/O device, such as the audio/video router of FIGS. 1a and 1b, optionally comprises a cover including a cord guide and an access opening for facilitating non I/O connections, such as power connections, communications connections and the like, to most efficiently utilize the space available in the rear of an audio/video router of the present invention and, as such, in the rear panel of the audio/video router, for maximizing a number of inputs and outputs, and as such, input and output connectors, able to be provided by an audio/video router in accordance with the present invention. Such an inventive cover is described in a commonly assigned patent application entitled "IMPROVED RACK UNIT FRAME HOUSING", the teachings of which are incorporated herein by reference in their entirety. For example, FIG. 4 depicts a high level diagram of a cover including a cord guide and an access opening suitable for use as a top cover or a bottom cover of an audio/video router in accordance with an embodiment of the present invention. The cover 400 of FIG. 4 illustratively comprises a cord guide 440 and an access opening 450. That is, in the cover 400 of FIG. 4, a cord guide 440 is formed along the top of the cover 400 such that a cord for facilitating a non-I/O connection, such as a power connection, communications connection and the like, can be placed and routed within the cord guide 440. The cord guide 440 terminates with the access opening 450. The cord guide 440 and the access opening 450 depicted in the cover 400 of FIG. 4 provide a novel means for facilitating a non-I/O connection to an audio/video router of the present invention (i.e., connecting a power cord to a power receptacle of the audio/video router) that allows for more connectors and as such connections to be provided near the rear and as such on a rear panel of an audio/video router in accordance with the present invention. In an audio/video router in accordance with the present invention, either the top cover alone, the bottom cover alone, or both covers can comprise a cord guide and an access opening for facilitating non-I/O connections in accordance with the present invention.

The size and shape of the cord guide in a cover of an audio/video router in accordance with the present invention depends on the size and numbers of cords to be routed along the top cover of the rack unit for facilitating the connection(s) of the audio/video router. As such, although in FIG. 4 the cord guide 440 is depicted as comprising a specific size and shape, it will be appreciated by one skilled in the art and informed by the teachings of the present invention, that a cord guide of the present invention may comprise substantially any size and shape needed to maintain and guide a cord or cords needed to facilitate a non-I/O connection or non-I/O connections of an audio/video router of the present invention.

The access opening 450 of the cover 400 of FIG. 4 provides access to a connection and as such a receptacle for the connection of an audio/video router in accordance with the present invention. For example, in one embodiment of the present invention, a power cord is routed along the cord guide 440 of the cover 400 and a power connector at the end of the power cord is connected to a power receptacle of the audio/video router made accessible by the access opening 450 of the cover 400. As with the cord guide, the size and shape of an access opening in a cover of an audio/video router in accordance with the present invention depends on the size and numbers of connectors (connection receptacles) and connections to be made. As such, although in FIG. 4 the access opening 450 is depicted as comprising a specific size and shape, it will be appreciated by one skilled in the art and informed by the teachings of the present invention, that an access opening of the present invention may comprise substantially any size and shape needed to facilitate a connection or connections of an audio/video router in accordance with the present invention.

In embodiments of an audio/video router of the present invention as described above, the connections of the audio/video router are located near the forward half of the audio/video router. Having such a configuration (i.e., having a power supply circuitry chamber and power connection located near the forward half of the audio/video router), an audio/video router in accordance with the present invention provides more available space near the rear of the audio/video router and as such in the rear panel for input and output connections, such as input and output audio and video connections for the audio/video router.

In addition and as depicted in FIG. 4, the cord guide 440 can optionally further include projections 427 (e.g., tabs) to keep a routed cord in the cord guide 440. Such projections 427 can be manufactured as an integral part of the cover 400 as depicted in FIG. 4. In one embodiment of the present invention, the projections (tabs) 427 create an interference fit for a cord guided by the cord guide 440 such that the cord does not inadvertently come out of the cord guide 440.

Although in FIG. 4 the cord guide 440 and the access opening 450 in the cover 400 of an audio/video router are depicted as being located near the center of the cover 400, in alternate embodiments of the present invention a cord guide and an associated access opening may be located substantially anywhere along the cover to facilitate the connection of a cord to the connection receptacle as described herein. Furthermore, although in FIG. 4 only one cord guide 440 and access opening 450 are depicted, alternate embodiments of an audio/video router in accordance with the present invention may comprise more than one cord guide and access opening for facilitating more than one connection. That is, a cover of an audio/video router in accordance with the present invention may comprise any combination of cord guides and access openings for facilitating connections to one or more included connector receptacles.

While the forgoing is directed to various embodiments of the present invention, other and further embodiments of the invention can be devised without departing from the basic scope thereof. As such, the appropriate scope of the invention is to be determined according to the claims, which follow.

The invention claimed is:

1. An input/output (I/O) device, comprising:
a motherboard including a plurality of locating slots and a plurality of connectors arranged on said motherboard such that when said motherboard is mounted in said I/O device, the plurality of connectors are positioned horizontally across the outside of said I/O device; and
a plurality of I/O cards, each of said I/O cards including a respective locating slot and at least two I/O connectors;
wherein the locating slot of each of said I/O cards mates with a respective locating slot of said motherboard such that when assembled, the at least two I/O connectors of each of said I/O cards vertically straddle a respective one of said plurality of connectors of said motherboard, the at least two I/O connectors are also protruding outside of said I/O device.

2. The I/O device of claim 1, further comprising:
a connection receptacle; and
a cover for removable attachment to said I/O device, said cover comprising an opening for permitting a connector on a cord to extend through the cover to releasably engage the receptacle in the I/O device, and a channel originating at said opening for receiving and guiding the cord.

3. The I/O device of claim 2, wherein said receptacle comprises a power receptacle, said cord comprises a power cord and said connector comprises a power connector.

4. The I/O device of claim 2, wherein said receptacle comprises a communications receptacle, said cord comprises a communications cord and said connector comprises a communications connector.

5. The I/O device of claim 2, wherein said cover further comprises projections along said channel for keeping the cord in said channel.

6. The I/O device of claim 2, wherein said cover comprises a top cover for said I/O device.

7. The I/O device of claim 2, wherein said cover comprises a bottom cover for said I/O device.

8. The I/O device of claim 1, wherein each of said I/O cards comprises:
metallic I/O connectors;
a printed circuit board (PCB); and
a metallic tab formed on said PCB, said metallic tab formed such that when each of said I/O card is installed into a metallic housing of said I/O device, said metallic tab contacts said metallic housing and bends back until the metallic tab makes contact with the body of at least one of said metallic I/O connectors thus creating a continuous grounding loop from said contacted metallic I/O connector to said metallic housing.

9. The I/O device of claim 8, wherein said metallic tab is formed using solder.

10. The I/O device of claim 8, wherein the locating slot of at least one of said I/O cards and a respective locating slot of said motherboard are metallically lined such that when said at least one I/O card is mated with the respective locating slot of said motherboard, a continuous grounding loop is created between at least said metallic housing, said motherboard, said I/O card and said contacted metallic I/O connector.

11. The I/O device of claim 10, wherein said metal comprises solder.

12. The I/O device of claim 1, wherein said I/O device comprises an audio/video router, said I/O card comprises an audio/video I/O card, said I/O connectors comprise BNCs, and said motherboard comprises a matrix card.

* * * * *

UNITED STATES PATENT AND TRADEMARK OFFICE
CERTIFICATE OF CORRECTION

PATENT NO. : 7,623,358 B2 Page 1 of 1
APPLICATION NO. : 11/578398
DATED : November 24, 2009
INVENTOR(S) : Miller et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 76 days.

Signed and Sealed this

Twenty-sixth Day of October, 2010

David J. Kappos
*Director of the United States Patent and Trademark Office*